(12) United States Patent
Chang

(10) Patent No.: US 9,018,025 B2
(45) Date of Patent: *Apr. 28, 2015

(54) SEMICONDUCTOR DEVICE AND A METHOD OF MANUFACTURING THE SAME

(71) Applicant: Phostek Inc., Grand Cayman (KY)

(72) Inventor: Yuan-Hsiao Chang, Taipei (TW)

(73) Assignee: Phostek Inc., Grand Cayman (KY)

( * ) Notice: Subject to any disclaimer, the term of this patent is extended or adjusted under 35 U.S.C. 154(b) by 0 days.

This patent is subject to a terminal disclaimer.

(21) Appl. No.: 14/217,953

(22) Filed: Mar. 18, 2014

(65) Prior Publication Data

US 2014/0199793 A1  Jul. 17, 2014

Related U.S. Application Data

(63) Continuation of application No. 13/540,445, filed on Jul. 2, 2012, now Pat. No. 8,728,834.

(30) Foreign Application Priority Data

Jun. 4, 2012 (TW) .............................. 101119907 A

(51) Int. Cl.
| H01L 21/02 | (2006.01) |
| H01L 33/02 | (2010.01) |
| H01L 33/20 | (2010.01) |
| H01L 33/38 | (2010.01) |
| H01L 33/00 | (2010.01) |
| H01L 31/18 | (2006.01) |
| H01L 31/0224 | (2006.01) |
| H01L 31/05 | (2014.01) |
| H01L 31/055 | (2014.01) |
| H01L 31/0475 | (2014.01) |

(52) U.S. Cl.
CPC ................ *H01L 33/02* (2013.01); *H01L 33/20* (2013.01); *H01L 33/38* (2013.01); *H01L 2933/0016* (2013.01); *H01L 33/0079* (2013.01); *H01L 31/18* (2013.01); *H01L 31/022433* (2013.01); *H01L 31/0504* (2013.01); *H01L 31/0508* (2013.01); *H01L 31/055* (2013.01); *H01L 31/0475* (2014.12); *Y02E 10/52* (2013.01)

(58) Field of Classification Search
CPC ... H01L 21/67; H01L 21/6705; H01L 21/677; H01L 21/683
USPC ........................................ 438/26, 47
See application file for complete search history.

(56) References Cited

U.S. PATENT DOCUMENTS

| 8,080,828 B2 | 12/2011 | Krames et al. |
| 8,728,834 B2 * | 5/2014 | Chang .............................. 438/26 |
| 2008/0217601 A1 | 9/2008 | Erchak et al. |
| 2008/0258133 A1 | 10/2008 | Seong |
| 2009/0090932 A1 | 4/2009 | Bour et al. |
| 2010/0295088 A1 | 11/2010 | D'Evelyn et al. |
| 2011/0260196 A1 | 10/2011 | Okagawa et al. |
| 2013/0056777 A1 | 3/2013 | Jorgenson |

* cited by examiner

*Primary Examiner* — Michael Lebentritt
(74) *Attorney, Agent, or Firm* — WPAT, PC; Justin King

(57) ABSTRACT

A semiconductor device is manufactured by forming at least one epitaxial structure over a substrate. A portion of the substrate is cut and lifted to expose a partial surface of the epitaxial structure. A first electrode is then formed on the exposed partial surface to result in a vertical semiconductor device.

12 Claims, 5 Drawing Sheets

200

| second doped layer | ~227 |
| active layer | ~226 |
| first doped layer | ~225 |
| tunnel junction | ~224 |
| second doped layer | ~223 |
| active layer | ~222 |
| first doped layer | ~221 |
| substrate | ~21 |

{227, 226, 225} → 22'
{223, 222, 221} → 22

US 9,018,025 B2

SEMICONDUCTOR DEVICE AND A METHOD OF MANUFACTURING THE SAME

CROSS-REFERENCE TO RELATED APPLICATION

This application is a Continuation of pending U.S. patent application Ser. No. 13/540,445, "SEMICONDUCTOR DEVICE AND A METHOD OF MANUFACTURING THE SAME", filed Jul. 2, 2012, which claims the benefit of Taiwan Patent Application No. 101119907, filed Jun. 4, 2012, the subject matter of which is incorporated herein by reference.

BACKGROUND OF THE INVENTION

1. Field of the Invention

The present invention generally relates to a semiconductor device, and more particularly to a vertical semiconductor device.

2. Description of Related Art

FIG. 1 shows a perspective view of a conventional semiconductor device 100, which includes, from bottom to top, a sapphire substrate 11, an n-type doped layer 12, an active layer 13, a p-type doped layer 14, a transparent contact layer 15, a negative electrode 16 and a positive electrode 17. A light emitting diode (LED) configured in accordance with the structure shown is called a horizontal LED because its current flows horizontally from the positive electrode 17 to the negative electrode 16. Current crowding ordinarily occurs under the negative electrode 16, and thus increases operating voltage, dynamic resistance, and temperature in the semiconductor device 100.

Accordingly, a need has thus arisen for a novel semiconductor device to overcome the current crowding and increased temperature.

SUMMARY OF THE INVENTION

In view of the foregoing, embodiments of the present invention provide a vertical semiconductor device and a method of manufacturing the vertical semiconductor device, which may reduce or prevent the current crowding, the increased voltage, the increased dynamic resistance, and the increased temperature in the conventional horizontal semiconductor device.

According to one embodiment, a substrate is provided and at least one epitaxial structure is formed over the substrate. A portion of the substrate is cut and lifted to expose a partial surface of the epitaxial structure. A first electrode is then formed on the exposed partial surface.

DETAILED DESCRIPTION OF THE INVENTION

FIG. 2A to FIG. 2F show cross-sectional or perspective views of manufacturing a semiconductor device 200 according to a first embodiment of the present invention. Although a light emitting diode (LED) and a photovoltaic (PV) cell are exemplified in the embodiment, it is appreciated that the embodiment may be adapted to other semiconductor devices such as transistors or diodes in general.

Figure 2A:
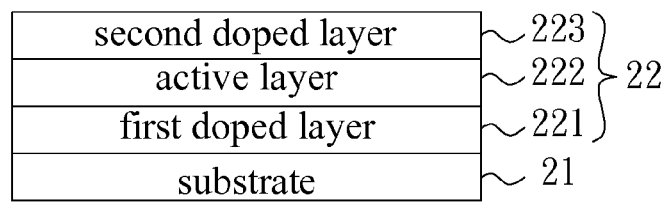
FIG. 2A to FIG. 2F show cross-sectional or perspective views of manufacturing a semiconductor device according to a first embodiment of the present invention.

As shown in FIG. 2A, a substrate 21 is first provided. In the embodiment, the material of the substrate 21 may absorb light of a first spectral band and may be penetrated by light of a second spectral band, which is distinct from the first spectral band. Taking an LED as an example, the second spectral band may range between 400 nanometer (nm) and 1600 nm. Taking a PV cell as another example, the second spectral band may range between 200 nm and 2000 nm. Moreover, the substrate 21 may include an insulating material, such as sapphire, glass, or quartz. Further, the substrate 21 may include a polar substrate, a semi-polar substrate, or a non-polar substrate.

Subsequently, at least one epitaxial structure 22 is formed over the substrate 21 by an epitaxial processing technique. In the embodiment shown, the epitaxial structure 22 includes a first doped layer 221, an active layer 222, and a second doped layer 223 in order. The first doped layer 221 is close to the substrate 21, the second doped layer 223 is distant from the substrate 21, and the active layer 222 is deposited between the first doped layer 221 and the second doped layer 223. Further, the first doped layer 221 has an electrical type opposite to the second doped layer 223. For example, the first doped layer 221 is n-type doped, and the second doped layer 223 is p-type doped. The active layer 222 may include a single quantum well (SQW) or multiple quantum wells (MQW). The epitaxial structure 22 of the embodiment may include a material of group III nitride compound, such as indium nitride (InN), gallium nitride (GaN), aluminum nitride (AlN), indium gallium nitride (InGaN), or indium aluminum gallium nitride (InAlGaN).

Figure 2B:
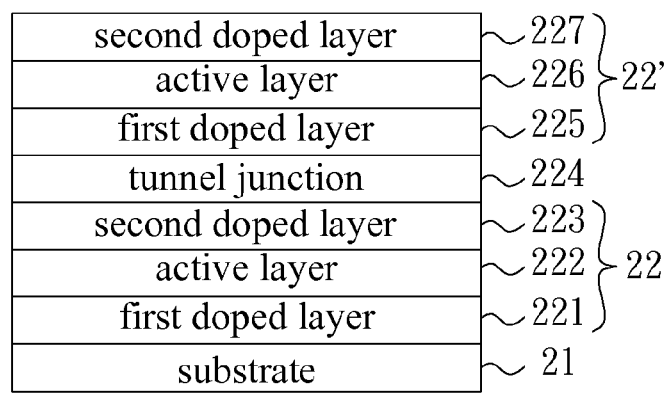

FIG. 2B shows a modified cross section of FIG. 2A. In the embodiment shown, a number of epitaxial structures, e.g., epitaxial structures 22 and 22', are formed over the substrate 21 in order, resulting in a stacked epitaxial structure over the substrate 21. The epitaxial structure 22' is stacked on the epitaxial structure 22 via a tunnel junction 224. The epitaxial structure 22' of the embodiment includes a first doped layer 225, an active layer 226, and a second doped layer 227 in order. The first doped layer 225 is close to the tunnel junction 224, the second doped layer 227 is distant from the tunnel junction 224, and the active layer 226 is deposited between the first doped layer 225 and the second doped layer 227. Further, the first doped layer 225 has an electrical type opposite to the second doped layer 227. For example, the first doped layer 225 is n-type doped and the second doped layer 227 is p-type doped. The active layer 226 may include a single quantum well (SQW) or multiple quantum wells (MQW). The epitaxial structure 22' of the embodiment may include a material of group III nitride compound, such as indium nitride (InN), gallium nitride (GaN), aluminum nitride (AlN), indium gallium nitride (InGaN), or indium aluminum gallium nitride (InAlGaN).

Figure 2C:
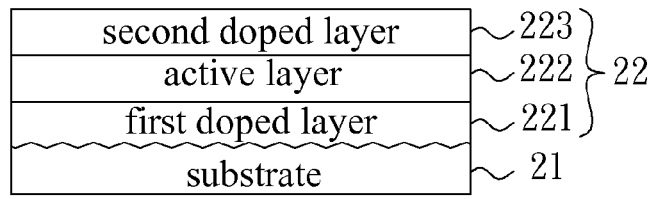

As shown in FIG. 2C, the surface of the substrate 21 may be further subjected to patterning before the epitaxial structure 22 is formed over the substrate 21. Taking an LED as an example, the substrate 21 with the patterned surface may enhance light scattering to increase an amount of light emission. Taking a PV cell as another example, the substrate 21 with the patterned surface may benefit photoelectric conversion by causing light to traverse back and forth in the epitaxial structure 22.

Figure 2D:
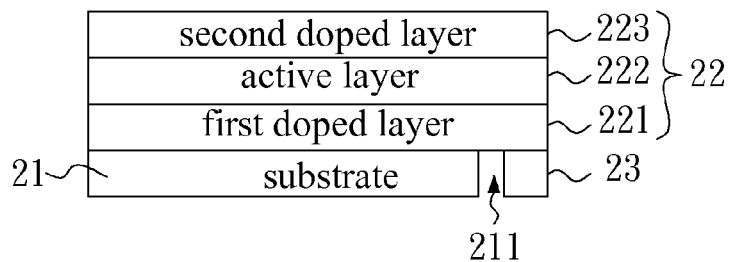
Figure 2E:
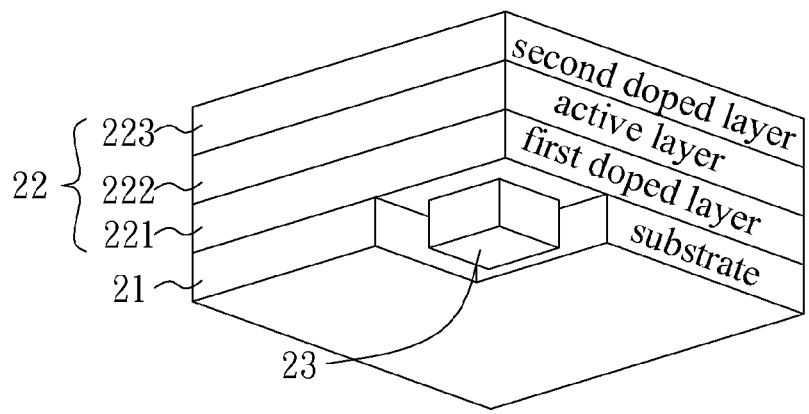

Afterward, as shown in the cross section of FIG. 2D or the perspective of FIG. 2E, a portion of the substrate 21 is cut and lifted to expose a partial surface of the first doped layer 221, therefore resulting in a hollow region 211. In the embodiment shown, the substrate 21 is cut and lifted by a laser lifting technique, which generates laser light with wavelength within the first spectral band. As the material of the substrate 21 may absorb light of the first spectral band, the substrate 21 may thus absorb the laser light, and the portion of the substrate 21 subjected to the laser light may accordingly be lifted to result in the hollow region 211.

The shape and location of the hollow region 211 are not limited to that shown in FIG. 2D/2E. In one embodiment, the substrate 21 may be further subjected to polishing to reduce its thickness before cutting and lifting the substrate 21. The polished substrate 21 with reduced thickness may allow more light of the second spectral band to penetrate the substrate 21, and may be favorable to the performance of cutting and lifting the substrate 21. Subsequently, a first electrode 23 is formed on the exposed surface of the first doped layer 221 within the hollow region 211. The first electrode 23 may include a conductive material such as metal.

Figure 1:
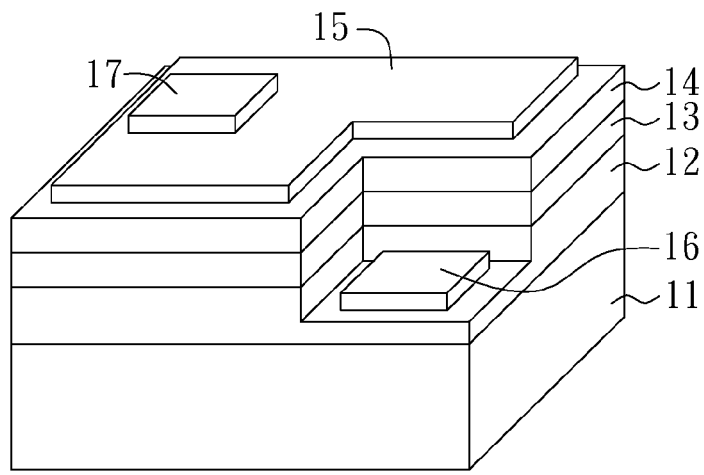
FIG. 1 shows a perspective view of a conventional semiconductor device.
Figure 2F:
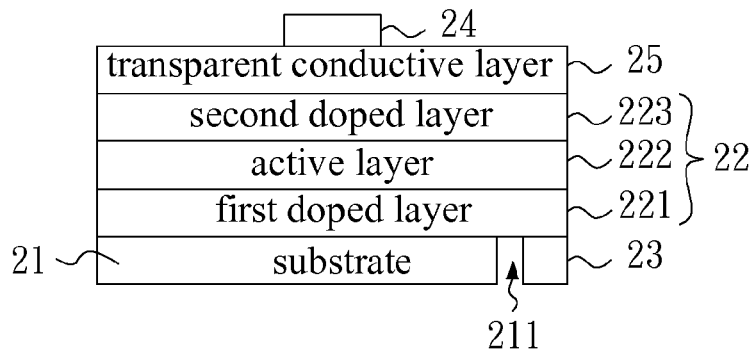

As shown in FIG. 2F, a second electrode 24 is formed on a surface of the epitaxial structure 22 (e.g., the second doped layer 223) opposite to the substrate 21. The second electrode 24 may include a conductive material such as metal. Accordingly, a vertical semiconductor device is thus attained, in which a current flows vertically from the second electrode 24 to the first electrode 23. The resultant structure of the embodiment does not possess current crowding effect as in the conventional horizontal semiconductor device (FIG. 1). In one embodiment, a transparent conductive layer (or transparent contact layer) 25 may be further formed between the second electrode 24 and the epitaxial structure 22 to enhance current spreading. The transparent conductive layer 25 may include a material such as antimony tin oxide (ATO), indium tin oxide (ITO), tin dioxide ($SnO_2$), aluminum doped sin oxide (AZO), gallium doped zinc oxide (GZO), or indium doped zinc oxide (IZO).

Figure 3A:
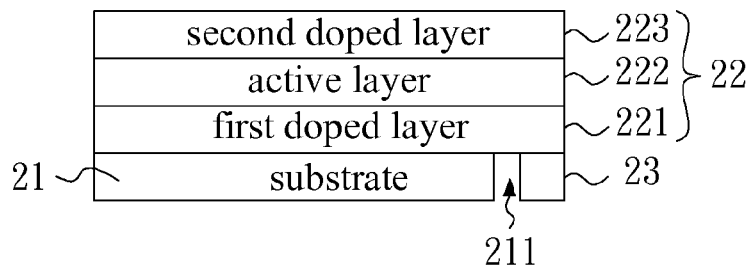
FIG. 3A to FIG. 3E show cross-sectional or perspective views of manufacturing a semiconductor device according to a second embodiment of the present invention.

FIG. 3A to FIG. 3E show cross-sectional or perspective views of how to manufacture a semiconductor device 300 according to a second embodiment of the present invention. As shown in FIG. 3A, an epitaxial structure 22 is formed over a substrate 21, and a first electrode 23 is formed on an exposed surface of the first doped layer 221 within a hollow region 211. Details of manufacturing the semiconductor device 300 are omitted here for brevity, and may be referred to the first embodiment as illustrated in FIG. 2A through FIG. 2E.

Figure 3B:
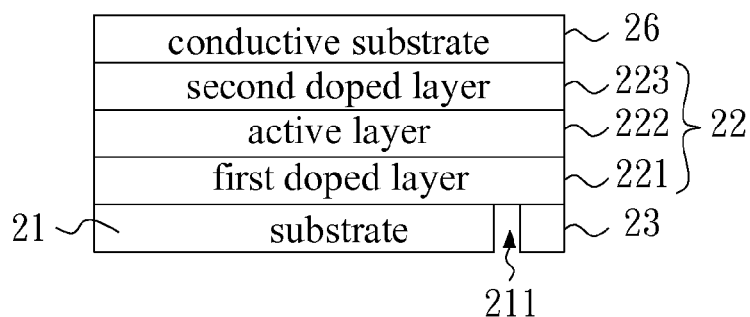
Figure 3C:
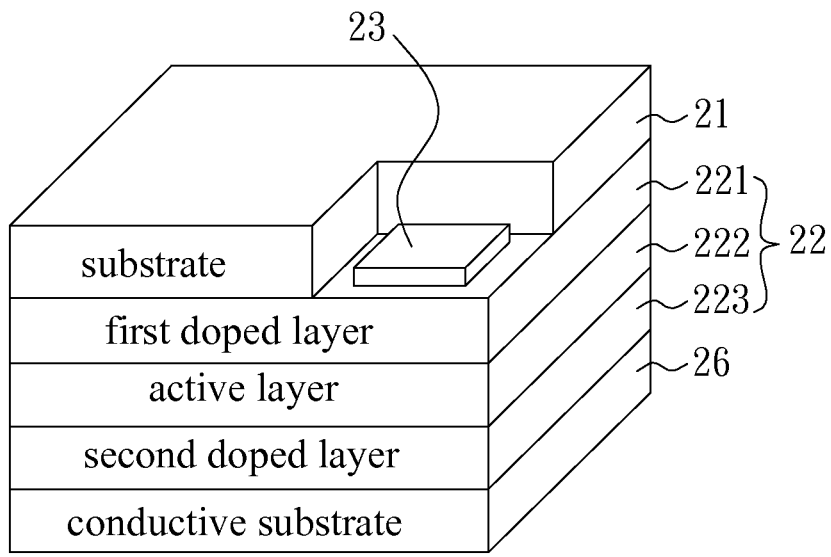

Subsequently, as shown in FIG. 3B, a conductive substrate 26 is provided as an electrode, and is coupled to a surface of the epitaxial structure 22 (e.g., the second doped layer 223) opposite to the substrate 21. The structure of FIG. 3B is flipped over to result in a flip semiconductor device as shown in the perspective of FIG. 3C. Taking an LED as an example, the substrate 21 may be used as a window layer, which not only provides protection, but also allows light of the second spectral band (e.g., 400 nm to 1600 nm) to be laterally emitted from the epitaxial structure 22. Taking a PV cell as another example, the substrate 21 may benefit photoelectric conversion by allowing light of the second spectral band (e.g., 200 nm to 2000 nm) to enter the epitaxial structure 22 laterally.

Figure 3D:
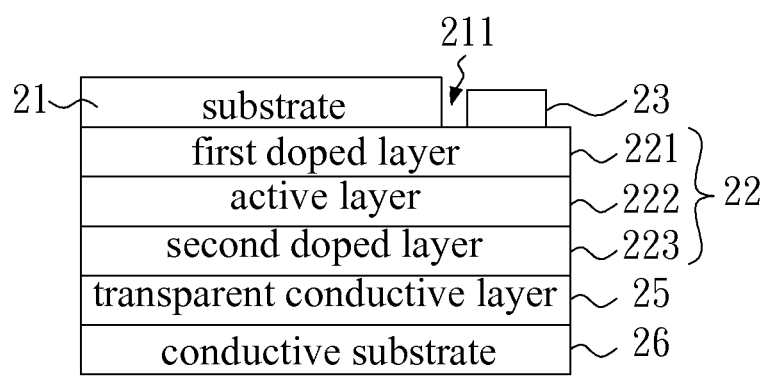

As shown in FIG. 3D, a transparent conductive layer 25 may be further formed between the conductive substrate 26 and the epitaxial structure 22 to enhance current spreading. The conductive substrate 26 may include a conductive and reflective material, such as metal, to enhance light emission or reuse the reflected light.

Figure 3E:
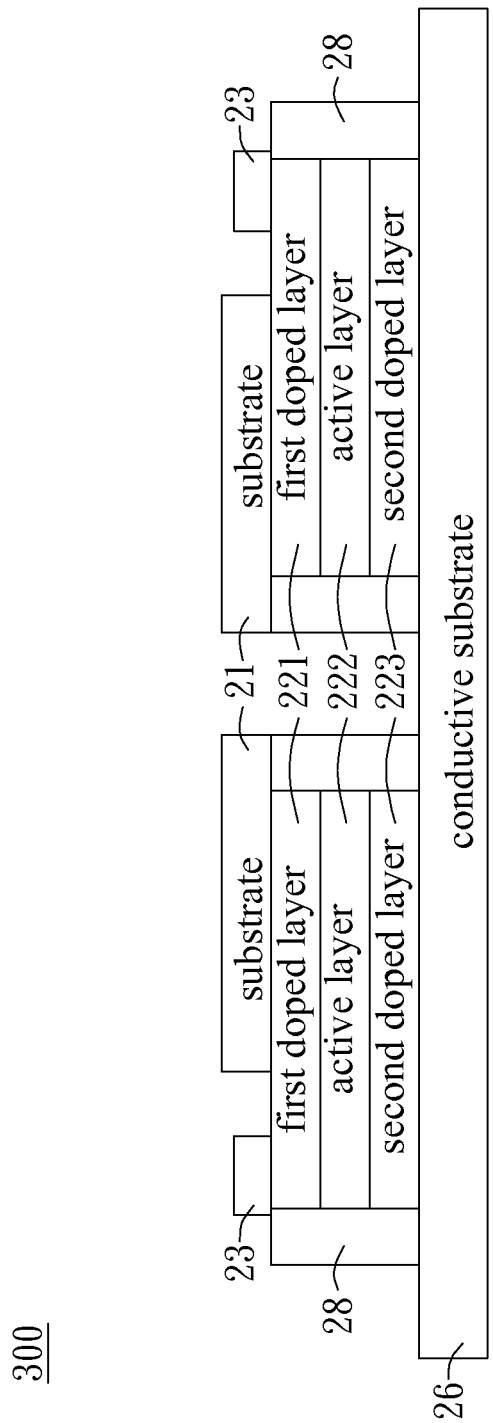

As shown in FIG. 3E, the conductive substrate 26 is coupled to a number of (e.g., two) flip semiconductor devices. In one embodiment, the structure of FIG. 3E may be manufactured by first producing an entire structure according the processes illustrated in FIG. 3A through FIG. 3D, and then subjecting the entire structure to etching to remove portions of the substrate 21 and the epitaxial structure 22 until portion of the conductive substrate 26 is exposed, therefore resulting in parallel-connected (or serial-connected) flip semiconductor devices or a semiconductor device array. In another embodiment, the structure of FIG. 3E may be manufactured by first producing a number of individual flip semiconductor devices according the process illustrated in FIG. 3A, and then coupling the individual flip semiconductor devices to a common conductive substrate 26, therefore resulting in parallel-connected flip semiconductor devices or a semiconductor device array. A passivation layer 28 may be further formed on sidewalls of the epitaxial structures 22 to prevent light interference between the neighboring flip semiconductor devices.

Although specific embodiments have been illustrated and described, it will be appreciated by those skilled in the art that various modifications may be made without departing from the scope of the present invention, which is intended to be limited solely by the appended claims.

What is claimed is:

1. A semiconductor method of manufacturing a semiconductor device, comprising:
   providing a substrate;
   forming at least one epitaxial structure over the substrate;
   removing a portion of the substrate to expose a partial surface of the epitaxial structure; and
   forming a first electrode on the exposed partial surface.

2. The method of claim 1, wherein the substrate is cut and lifted by a laser lifting technique, which generates a laser light with wavelength within a first spectral band.

3. The method of claim 2, wherein the substrate comprises a material that may absorb light of the first spectral band and may be penetrated by light of a second spectral band, which is distinct from the first spectral band.

4. The method of claim 2, wherein said removing process comprising:
   the substrate absorbs the light of the first spectral band so as to be cut to define a hollow region;
   the substrate is penetrated by light of the second spectral band;
   the epitaxial structure absorbs the light of the second spectral band so as to gasifying the surface of the hollow region between the substrate and the epitaxial structure; and then,
   the substrate is lift by the light of the second spectral band to form the hollow region.

5. The method of claim 2, wherein the strength of the laser light is modified, so the epitaxial structure absorbs the light of the second spectral band but not be cut.

6. The method of claim 1, wherein the substrate comprises an insulating material.

7. The method of claim 1, wherein the epitaxial structure comprises a material of group III nitride compound.

8. The method of claim 1, wherein the epitaxial structure comprises a plurality of the epitaxial structures, which are stacked up to result in a stacked epitaxial structure by a tunnel junction between the neighboring epitaxial structures.

9. The method of claim 1, before forming the epitaxial structure, further comprising:
   patterning a surface of the substrate facing the epitaxial structure.

10. The method of claim 1, before cutting and lifting the substrate, further comprising:
    polishing the substrate to reduce a thickness of the substrate.

11. The method of claim 1, further comprising:
forming a second electrode on a surface of the epitaxial structure opposite to the substrate.

12. The method of claim 1, further comprising:
providing a conductive substrate; and
coupling the conductive substrate to a surface of the epitaxial structure opposite to the substrate.

\* \* \* \* \*